United States Patent [19]

Komazaki et al.

[11] Patent Number: 5,323,127
[45] Date of Patent: Jun. 21, 1994

[54] BRANCHING FILTER HAVING SPECIFIC IMPEDANCE AND ADMITTANCE CHARACTERISTICS

[75] Inventors: Tomokazu Komazaki; Katsuhiko Gunji; Norio Onishi; Akira Mashimo; Kouichi Ichikawa, all of Tokyo, Japan

[73] Assignee: Oki Electric Industry Co., Ltd., Tokyo, Japan

[21] Appl. No.: 3,837

[22] Filed: Jan. 11, 1993

Related U.S. Application Data

[63] Continuation of Ser. No. 736,701, Jul. 26, 1991, abandoned.

[30] Foreign Application Priority Data

Jul. 27, 1990 [JP] Japan .................. 3-197709

[51] Int. Cl.$^5$ .................. H01P 1/213; H03H 7/46
[52] U.S. Cl. .................. 333/126; 333/129; 333/132; 333/134; 333/202; 455/82; 455/83
[58] Field of Search .......... 333/134, 126, 129, 202, 333/132; 455/78, 82, 83; 370/36, 38

[56] References Cited

U.S. PATENT DOCUMENTS 5,015,973  5/1991  Kawakami et al. ............ 333/134 X
5,023,866  6/1991  DeMuro ........................ 333/134 X

FOREIGN PATENT DOCUMENTS

82/03730   10/1982  European Pat. Off. ........ H01P 5/12
0356572     3/1990  European Pat. Off. ..... H01P 1/213
57-204603   3/1983  Japan ...................... H01P 1/213
80901       4/1986  Japan .
136104      6/1987  Japan .
136105      6/1987  Japan .
60004       3/1989  Japan .
260701     10/1990  Japan ............................ 333/134
511079      8/1939  United Kingdom ................ 455/82

OTHER PUBLICATIONS

Kunemund et al., "Veranderbare Bandpasse und Weichen fur Zenitmeterwellen," *Entwick lungsberichte*, vol. 25, No. 2, pp. 117–122 (Nov. 19, 1962).

*Primary Examiner*—Benny Lee
*Attorney, Agent, or Firm*—Edward D. Manzo

[57] ABSTRACT

A branching filter in which an input/output port, a first dielectric filter for use in transmission and a second dielectric filter for use in reception are coupled with each other through a branching filter circuit. The branching filter circuit includes a first line provided between the input/output port and an input port of the second dielectric filter, a second line provided between the input/output port and an output port of the first dielectric filter, and a third line provided between the input/output port and the ground. In the filter, conductor lines for use in connection between ports are used for the first and second lines.

7 Claims, 10 Drawing Sheets

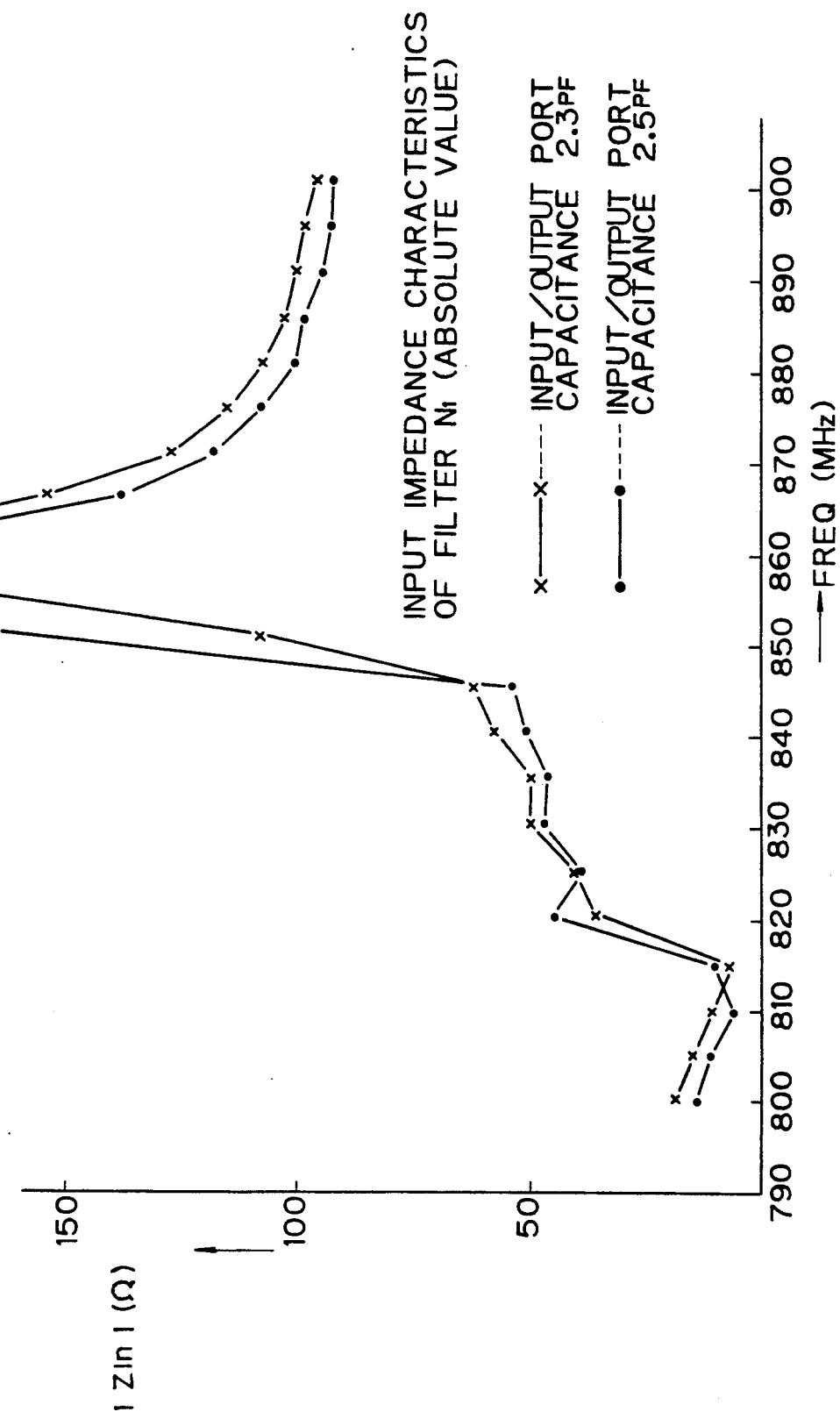

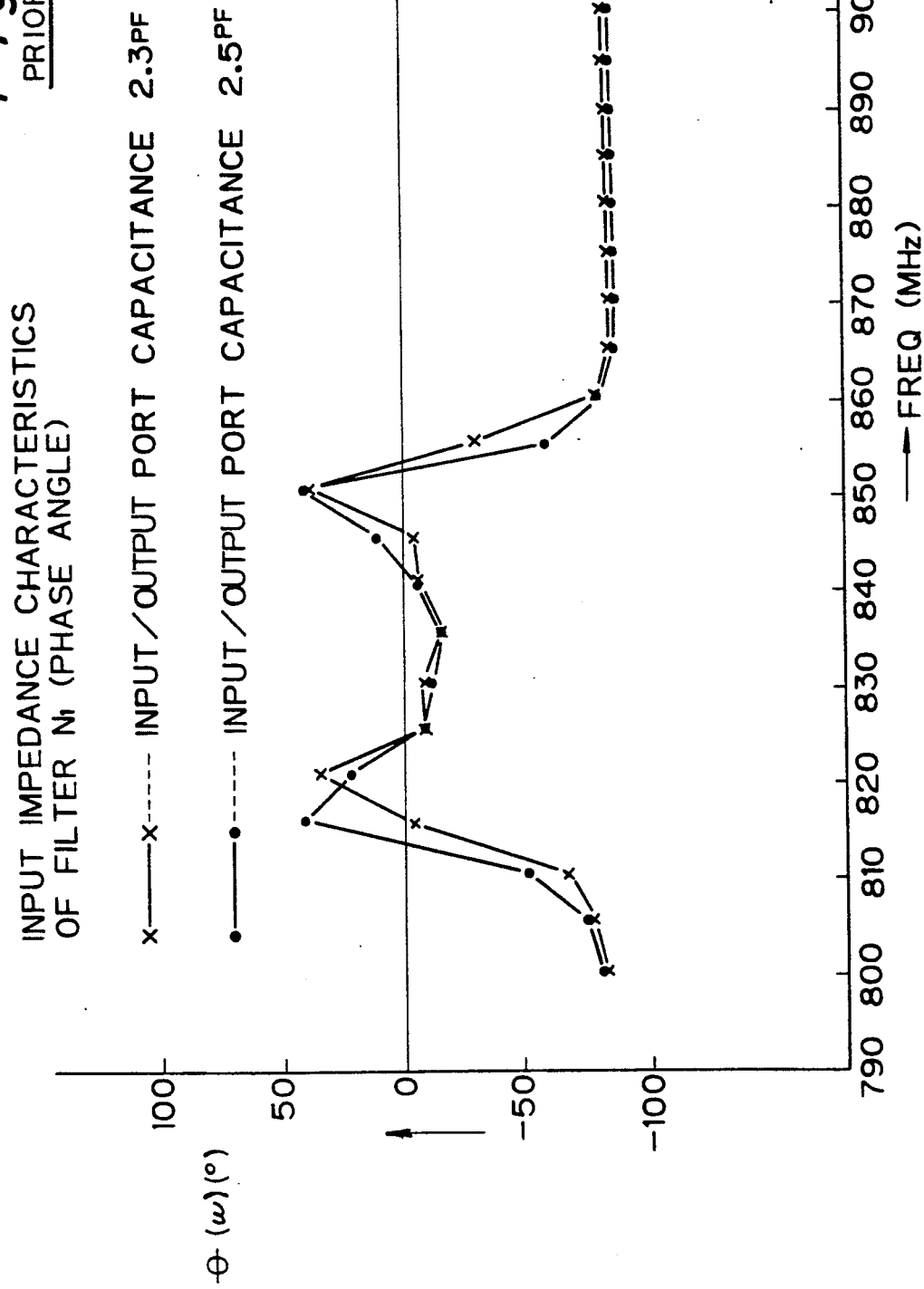

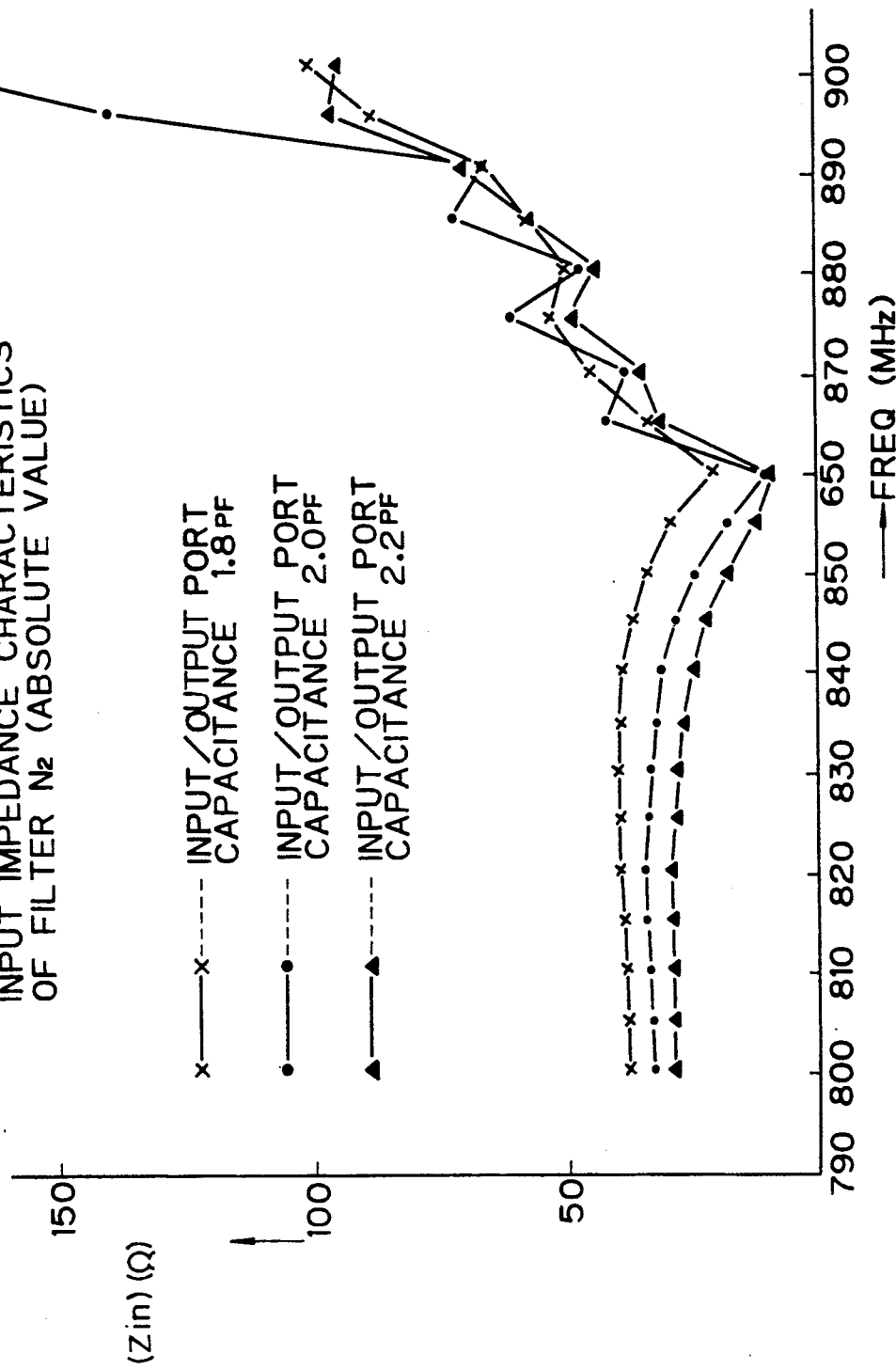

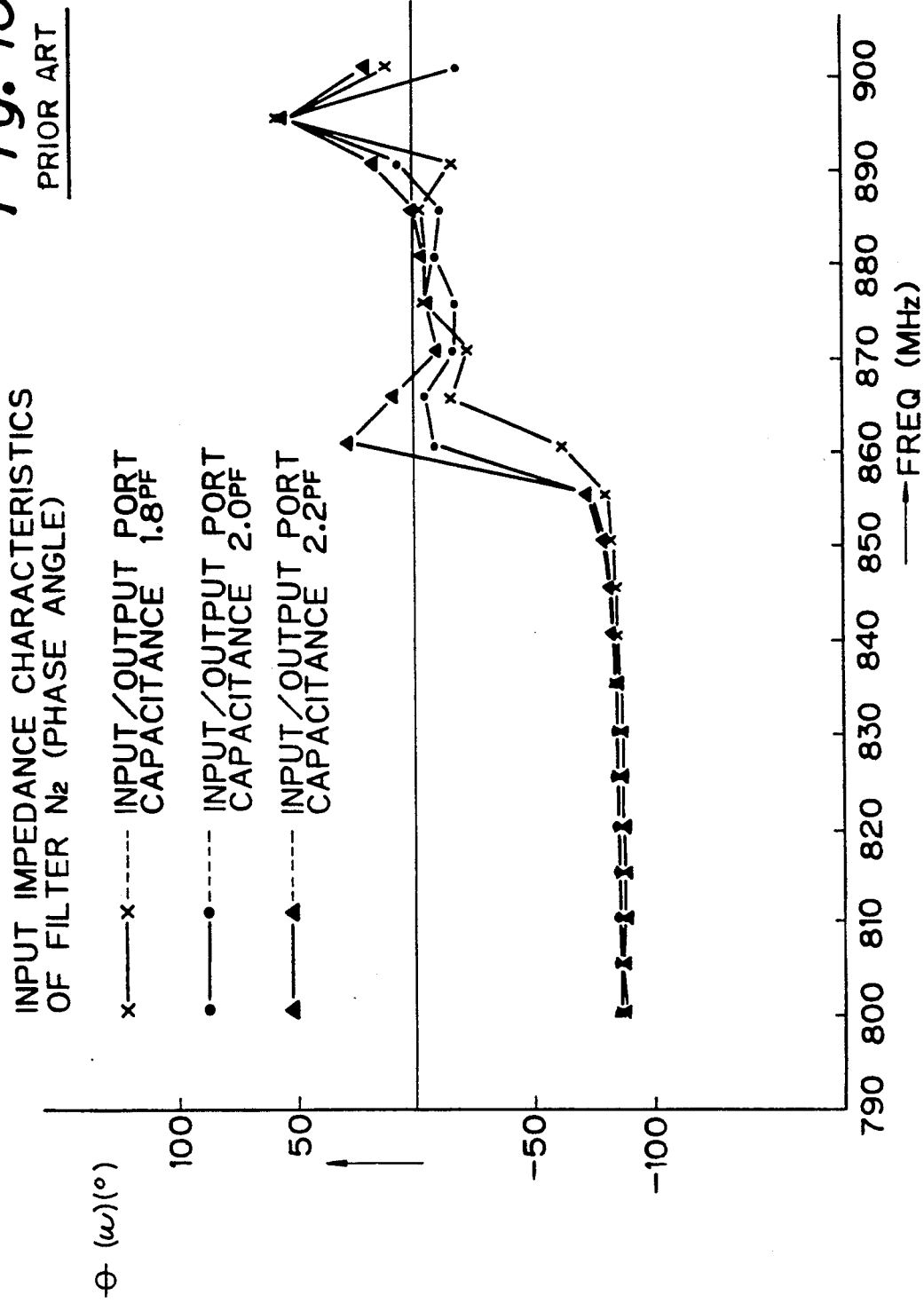

BRANCHING FILTER HAVING SPECIFIC IMPEDANCE AND ADMITTANCE CHARACTERISTICS

This is a continuation of application Ser. No. 07/736,701, filed Jul. 26, 1991 now abandoned.

BACKGROUND OF THE INVENTION

1. Field of the Invention

The present invention relates to a branching filter, which is particularly suitable for use in conjunction with telecommunications apparatus such as a radio transmitter and/or receiver apparatus for separating or multiplexing signals having different frequencies in accordance with the frequency.

2. Description of the Prior Art

Such a type of branching filters are known in Japanese patent laid-open publication Nos. 136104/1987 and 136105/1987, for example. See also U.S. Pat. No. 5,015,973 entitled "Duplexer with An Isolating Circuit On A Dielectric Plate" to Kawakami, Komazaki, Gunji, Onishi, Sakurai, Horii, and Mashimo, many of whom are co-inventors herein. FIGS. 3A and 3B show structures of such a type of conventional branching filter. FIG. 3A is a perspective view of the conventional branching filter, and FIG. 3B is a bottom perspective view of the same. This branching filter is provided with an insulative substrate 1 such as alumina or glass-epoxy resin, on a front side and a back side of which substrate there are formed a plurality of input/output terminals 3 and grounding conductor patterns 2 by means of thick-film printing, plating processing and the like. The plurality of input/output terminals 3, which are provided on the front side and the back side of the substrate 1, are formed in pairs, and each pair of terminals are coupled to each other by a through hole for connection between the front side and the back side. Referring to FIG. 3a, on the front side of the substrate 1, there are directly mounted transmitter dielectric filter 6 and receiving dielectric filter 7, which are mutually different in a central frequency.

In FIG. 3a, filters 6 and 7 are, as described in Japanese patent laid-open publication No. 80901/1986, for example, provided with a block configuration of filter main bodies 4 and 5 each consisting of unitary homogeneous dielectric, a plurality of dielectric resonators 8 and 12 each consisting of a cylindrical configuration of central conductor embedded at regular intervals within the filter main bodies 4 and 5, and a plurality of frequency regulation patterns 8 and 13 each connected to associated one of the central conductors of the dielectric resonators 8 and 12, formed in one side of the filter main bodies 4 and 5, respectively. At the both ends of the filter 6, there are provided input/output terminals 3 and input/output electrodes 14 and 15 connected with the through holes, and at the both ends of the filter 7, there are provided input/output terminals 3 and input/output electrodes 10 and 11 connected with the through holes. A resonance frequency of each of the dielectric resonators is determined by the height of a dielectric resonator and a frequency regulation pattern, and the regulation of the resonance frequency may be performed by mechanical or optical technical skill.

On the back side of the substrate 1 in FIG. 3b, there are formed a pair of branching or splitting filter circuits 16 and 17 comprising distributed constant lines such as strip lines, and a lowpass filter 18 for spurious suppression, by means of thick-film printing, plating processing and the like. The branching filter circuits 16 and 17 are connected through the input/output terminals 3 and the input/output electrodes 10, 11, 14 and 15 to the filters 6 and 7 on the front side, respectively.

In order to avoid mutual influence between the branching filter circuit 16 and the receiver filter 7 connected in series, and the branching filter circuit 17 and the transmitter filter 6 connected in series, it is needed to provide a sufficiently high input impedance for the branching filter circuit 17 and the transmitter filter 6, at a pass band central frequency of the branching filter circuit 16 and the receiver filter 7. Thus, the line length of each of the branching filter circuits 16 and 17 is determined as follows.

Now considering an application of a cascade connection of the branching filter circuits 16 and the receiver filter 7. In this case, and as discussed in the aforementioned Kawakami et al. U.S. Patent, a component $S_{11}(1)$ of an S dispersion matrix is given by the following equation (1):

$$S_{11}(1) = [r\cos\theta - \cos\theta + z\sin\theta + j(\sin\theta + z\cos\theta - r\sin\theta)]/[r\cos\theta + \cos\theta - z\sin\theta + j(\sin\theta + z\cos\theta + r\sin\theta)] \quad (1)$$

wherein $\theta = \beta l$, $\beta = 2\pi/\lambda$, $l$ = line length of the branching filter circuit 17, $\lambda$ is the wavelength of the receiver frequency, and $r + jz$ = input impedance for the transmitting filter with $r$ as the real part of the input impedance of the transmitter filter, $z$ is the constant term of the imaginary part and $j$ is the imaginary unit.

In order to provide a sufficiently high input impedance for the branching or multiplexing filter circuit 17 and the transmitter filter 6, at a pass band central frequency of the receiver filter 7, it is sufficient for component $S_{11}(1)$ of the equation (1) to be minimized. In other words, it is understood that parameter $\theta$ may be selected to satisfy the following equation (2).

$$\cos\theta = z\sin\theta \quad (2)$$

Substituting this into Equation (1) leads to Equation (3), as follows:

$$S_{11}(1) = [r\cos\theta + j(\sin\theta + z^2\sin\theta - r\sin\theta)]/[r\cos\theta + j(\sin\theta + z^2\sin\theta + r\sin\theta)] \quad (3)$$

Now, if the equation (3) is expressed by the input impedance (Zin), then $$Zin = [(1+z^2)/r] - jz \quad (4)$$

That is, it is needed to provide a sufficiently high input impedance for the branching filter circuit 17 and the transmitter filter 6 connected in series, as a pass band of the branching filter circuit 16 and the receiver filter 7 connected in series.

Thus, the branching filter circuit 17 and the transmitting filter 6 connected in series form an attenuator. In this case, it may be considered in the equation (4) that parameter r is sufficiently smaller than unity, that is, $r \leq 1$. Consequently, in the equation (4). $Zin \geq 1$, thus mutual influence may be avoided. It would be understood that in order to provide a sufficient large real part in the equation (4), an phase angle of Zin has to be zero.

However, according to the structure of the branching filter as mentioned above, the line length of the distributed constant line becomes approximately $\lambda/4$, and thus this becomes one of the critical drawbacks to miniaturization of the branching filter and achieving low-cost.

For example, take the case where a conductor having width 1.8 mm is formed on a glass-epoxy resin having thickness 1 mm (dielectric constant 4.8) so as to provide input impedance 50 Ω. The resulting relation between the line length and the phase angle is shown in FIG. 4. As apparent from FIG. 4, in order to obtain the phase angle 0°, a line length of 60 mm at the receiving side and a line length of 84 mm at the transmitting side are needed. Thus it would be difficult to achieve miniaturization of the filter and reduction in cost.

A branching filter by which the foregoing problem has been solved is disclosed in Japanese patent laid-open publication No. 60004/1989 (see also U.S. Pat. No. 5,015,973). FIGS. 5A and 5B hereof show structures of the branching filter disclosed in the JP laid-open publication. FIG. 5A is a perspective view of such a branching filter, and FIG. 5B is a bottom perspective view of the same. In those figures, reference numeral 20 denotes a substrate such as glass-epoxy resin; 21 a ground conductor pattern; 22 an antenna terminal; 23 and 25 terminals of Rx (receiver filter); 24 and 26 terminals of Tx (transmitter filter). Referring to FIG. 5a, 27 denotes a transmitter filter main body; 28 a receiver filter main body; 29 a transmitter filter; 30 a receiver filter; 31 a dielectric resonator of the receiver filter; 32 a frequency regulator pattern of the receiver filter; 33 a coupling amount regulator pattern of the receiver filter; 34 and 35 input/output terminals of the receiver filter; 36 a dielectric resonator of the transmitter filter; 37 a frequency regulator pattern of the transmitter filter; 38 a coupling amount regulator pattern of the transmitter filter; and 39 and 40 input/output terminals of the transmitter filter.

On the back side of the substrate 20 in FIG. 5b, there are formed inductors each comprising a fine line conductor. More specifically, reference numerals 41, 42 and 43 are directed to inductors $L_{AR}$ 41, $L_{RE}$ 42 and $L_{RT}$ 43, respectively, instead of a distributed constant circuit of the separating or branching filter circuit. Numeral 44 represents an exposure portion of the substrate.

The branching filter shown in FIGS. 5A and 5B is, for instance, a branching filter for U.S. AMPS (Advanced Mobile Phone Service) scheme land mobile radiotelephone use, which comprises a transmitter filter ($N_1$) 29 designed for a central frequency ($f_o$) of 835 MHz and a pass band (BW) of 825–845 MHz, a receiver filter ($N_2$) 30 designed with $f_o$ of 880 MHz and BW of 870–890 MHz, and a branching filter circuit.

FIG. 6 is a block diagram of the branching filter shown in FIGS. 5A and 5B (FIG. 6 corresponds generally to FIG. 2 of U.S. Pat. No. 5,015,973.). The mounted filters ($N_1$) 29 and ($N_2$) 30 are provided with a block configuration of filter main bodies 27 and 28 each consisting of unitary homogeneous dielectric, a plurality of dielectric resonators 31 and 36 each consisting of a cylindrical configuration of central conductor embedded at regular intervals within the filter main bodies 27 and 28, a plurality of frequency regulation patterns 32 and 37 each connected to the associated one of the central conductors of the dielectric resonators 31 and 36, formed in one side of the filter main bodies 27 and 28, and coupling amount regulator patterns 33 and 38 between associated ones of the frequency regulator patterns 32 and 37, respectively as seen in FIG. 5a. The dielectric resonators 31 and 36 located on both the sides of the individual filters are provided with input/output patterns 34, 35, 39 and 40, which are connected to input/output terminals 23, 25, 26 and 24, respectively as seen in FIG. 5b. The several terminals of FIGS. 5A and 5B are shown in the FIG. 6 schematic diagram.

FIG. 7 is a graph plotting input impedance characteristics (absolute value) of the transmitter filter $N_1$, in which a frequency (MHz) is given on a horizontal axis, and an absolute value of input impedance (Ω) is given on a vertical axis, In FIG. 7, there are shown two cases of input/output end capacitances 2.3 pF and 2.5 pF. As apparent from FIG. 7, the input impedance is approximately 50 Ω in the range of 825–845 MHz which is the pass band of transmitter filter $N_1$, and rapidly increases when the frequency exceeds such a pass band.

FIG. 8 plots input impedance characteristics (phase angle) of the transmitting filter $N_1$, in which frequency (MHz) is given on a horizontal axis, and phase angle $\theta(\omega)°$ is given on a vertical axis. In FIG. 8, there are shown two cases of input/output end capacitances 2.3 pF and 2.5 pF. As apparent from FIG. 8, the phase angle is approximately 0 at 825–845 MHz which is the pass band of the transmitting filter $N_1$.

FIG. 9 shows input impedance characteristics (absolute value) of the receiving filter $N_2$, in which frequency (MHz) is given on a horizontal axis, and an absolute value of input impedance (Ω) is given on a vertical axis. In FIG. 9, there are plotted three curves of input/output end capacitances 1.8 pF, 2.0 pF and 2.2 pF. As clear from FIG. 9, the input impedance is approximately 50 Ω at 870–890 MHz which is the pass band of the receiver filter $N_2$.

FIG. 10 is a view in which input impedance characteristics (phase angle) of the receiver filter $N_2$ are plotted with frequency (MHz) given on its horizontal axis and phase angle $\theta(\omega)°$ given on its vertical axis. In that figure, there are plotted three curves of input/output end capacitances 1.8 pF, 2.0 pF and 2.2 pF. As apparent from the figure, the phase angle is approximately 0 at 870–890 MHz which is the pass band of the receiving filter $N_2$.

It is thus understood that the branching or multiplexer filter as mentioned above is, as shown in FIGS. 5A, 5B and 6, provided with the inductors $L_{AR}$ 41, $L_{RE}$ 42 and $L_{RT}$ 43 instead of the distributed constant circuit.

A principle of the branching filter as mentioned above will be described hereinafter on the basis of the operation of those inductors. First, let us consider an instance of no inductors $L_{AR}$ 41, $L_{RE}$ 42 and $L_{RT}$ 43. As a matter of convenience in description, there will be stated only the central frequencies $f_o = 835$ (MHz), $f_o = 880$ (MHz) of the respective pass bands ($B_1$, $B_2$) of the transmitter and receiver filters $N_1$ and $N_2$.

Regarding $B_1$ [$f_o = 835$ (MHz)] and $B_2$ [$f_o = 880$ (MHz)], they are considered from FIGS. 7–10 as follows:

$B_1$: $r_1 = 50.0$     $x_1 = 0$
     $r_2 = 0$        $x_2 = -j\,30$ $B_2$: $r_1 = 0$        $x_1 = -j\,186.0$
     $r_2 = 50.0$    $x_2 = 0$ where $r_1$ is the real part of the input impedance of the transmitter filter when the input impedance is expressed as $r + jz$, $x_1$ is the constant term of the imaginary part thereof, $r_2$ is the real part of the input impedance of the receiver filter when the input impedance is expressed as $r+jz$ and $x_2$ is the constant term of the imaginary part thereof If the branching filter is constituted by using those transmitting and receiving filters, then input impedance Zin and mismatch accentuation amount or return loss RL, seeing from antenna terminal 22, are given as follows:

$$B_1: \quad Zin = 13.254 - j\,22.068$$
$$RL = 3.88 \text{ dB}$$
$$B_2: \quad Zin = 46.62 - j\,12.541$$
$$RL = 17.5 \text{ dB}$$

From the foregoing, it is apparent that the input impedance Zin and the Return Loss result in an undesirable reduction compared with a case of unity of the transmitting filter $N_1$ or the receiving filter $N_2$. Further, it is a problem that $X_2$ is small at the band $B_1$. Under such a condition that $x_2$ is small, the inductor $L_{RT}=5$ (nH) is connected in series to the transmitter filter $N_1$ so that the input impedance Zin at the band $B_1$ may approach a reference impedance ($R_o = 50\,\Omega$). Input impedance $Z_{in}$ and mismatch attenuation amount RL, at that time, are given as follows:

$$B_1: \quad Zin = 17.9 - j\,28.6644$$
$$RL = 4.67 \text{ dB}$$
$$B_2: \quad Zin = 45.4545 - j\,14.341$$
$$RL = 16.15 \text{ dB}$$

Next, the inductor $L_{RE}$ will be described hereinafter. If there is provided the inductor $L_{RE}$ of 20 nH, that is, $L_{RE}=20$ nH, then input impedance Zin and mismatch attenuation amount RL, at $B_1$ and $B_2$ after insertion of the inductor $L_{RE}$, are given as follows:

$$B_1: \quad Zin = 32.2633 - j\,31.874$$
$$RL = 7.67 \text{ dB}$$
$$B_2: \quad Zin = 49.14 - j\,6.7125$$
$$RL = 23.34 \text{ dB}$$

Hence, insertion of the inductor $L_{RE}$ serves to provide a relatively small imaginary part of $Z_{in}$ in comparison with a real part of Zin at the respective bands $B_1$ and $B_2$.

Next, the inductor $L_{AR}$ will be described. If there is provided the inductor $L_{AR}$ of 4 nH, that is, $L_{AR}=4$ nH, input impedance Zin and mismatch attenuation amount RL, at $B_1$ and $B_2$ after insertion of the inductor $L_{AR}$, are given as follows:

$$B_1: \quad Zin = 32.2633 - j\,10.888$$
$$RL = 12.01 \text{ dB}$$
$$B_2: \quad Zin = 49.14 + j\,28.834$$
$$RL = 11.08 \text{ dB}$$

Hence, insertion of the inductor $L_{AR}$ serves to provide a small imaginary part of Zin on an average basis at the respective bands $B_1$ and $B_2$. Thus, it is possible to obtain the branching filter satisfying $RL > 10$ dB necessary for the land mobile radiotelephone. While those inductors $L_{AR}$, $L_{RE}$ and $L_{RT}$ were explained by way of example, it is possible to expect a similar operation as far as the tendency of Zin of the those filters $N_1$ and $N_2$ is not changed.

Where the inductors $L_{AR}$, $L_{RE}$ and $L_{RT}$ are formed on a glass-epoxy resin substrate having the dielectric constant of 4.8 and the thickness of 1.6 mm, the inductance is given by the following relationships, where $f_o = 850$ (MHz), $l=$ line length:

(1) In case of W (width)=0.3 mm:

$$L(nH) = 1.389l\,(mm) - 5.3443$$

Thus, for instance, in cases of the above-mentioned inductors $L_{AR}$, $L_{RE}$ and $L_{RT}$, there are obtained the following cases of line length:

In case of $L_{RT}=5$ nH, $l=7.45$ mm
In case of $L_{RE}=20$ nH, $l=18.25$ mm
In case of $L_{AR}=4$ nH, $l=6.73$ mm (2) In case of W (width)=0.5 mm:

$$L(nH) = 1.092l\,(mm) - 2.4726$$

(3) In case of W (width)=0.7 mm:

$$L(nH) = 1.0135l\,(mm) - 2.1753$$

If the inductors are formed on a glass-epoxy resin substrate having the dielectric constant of 9.3, it is possible to further reduce the line length l.

Those conventional branching filters as mentioned above have, however, been associated with the following drawbacks.

(1) According to the branching filter shown in FIG. 3, the branching filter circuit is constructed on a $\lambda/4$ line basis. This structure causes the line of the branching filter circuit to relatively extend, and thus to enlarge the occupied area. Consequently, it is difficult to provide miniaturization of the filter and low-cost.

(2) According to the branching filter shown in FIG. 5A and 5B, the branching filter circuit is constructed on the basis of the inductor by the strip line so that the entire line length of the strip line can be shortened. However, that is limited in its shortening, so that the branching filter circuit may occupy some extent of area. This becomes drawbacks to miniaturization of the branching filter and achieving low-cost.

SUMMARY OF THE INVENTION

It is therefore an object of the present invention to provide a branching filter in which a branching filter circuit does not occupy an additional area on a substrate.

According to the present invention, the need of an additional area on a substrate is avoided by making lines for connection between parts on the substrate functioning as a branching filter circuit. More specifically, there is provided a branching filter wherein an input/output port, a first dielectric filter for use in transmission and a second dielectric filter for use in reception are coupled with each other through a branching filter circuit. The branching filter circuit includes a first line provided between said input/output port and an input port of said second dielectric filter, a second line provided between said input/output port and an output port of said first dielectric filter, and a third line provided between said input/output port and a reference potential. In branching filter, conductor lines for use in connecting between parts of the branching filter are used for the first and second lines.

BRIEF DESCRIPTION OF THE DRAWINGS

The objects and features of the present invention will become more apparent from the consideration of the following detailed description taken in conjunction with the accompanying drawings in which:

FIG. 3A is a perspective view of the branching filter, and FIG. 3B is a bottom perspective view of the same;

FIG. 5A is a perspective view of the branching filter, and FIG. 5B is a bottom perspective view of the same;

FIG. 7 plots input impedance characteristics (absolute value) of the transmitter filter $N_1$;

FIG. 8 plots input impedance characteristics (absolute value) of the transmitter filter $N_1$;

FIG. 9 plots input impedance characteristics (absolute value) of the receiver filter $N_2$; and FIG. 10 plots input impedance characteristics (phase angle) of the receiver filter $N_2$.

DESCRIPTION OF THE PREFERRED EMBODIMENT

Figure 1:
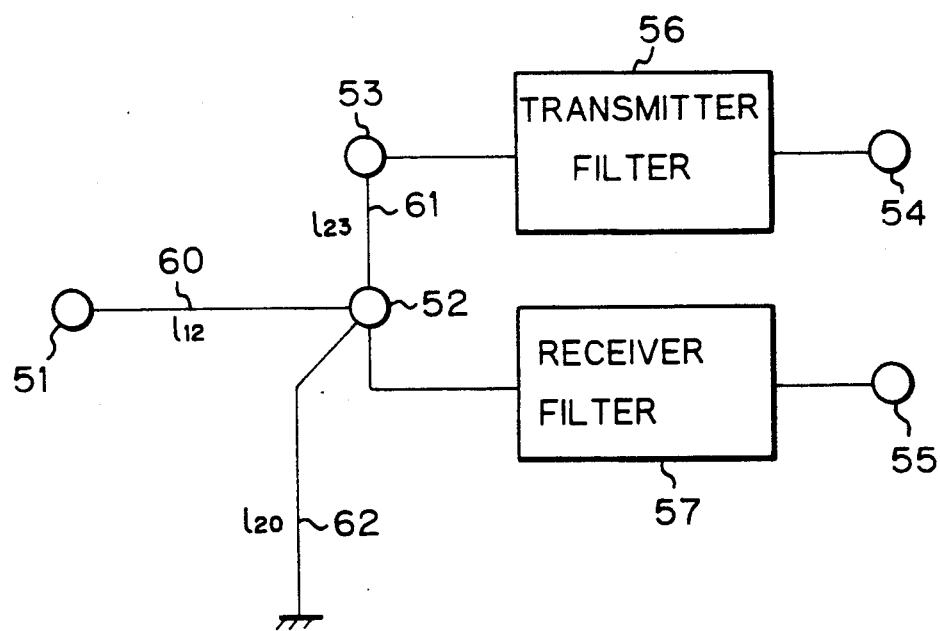
FIG. 1 is a schematic block diagram of a preferred embodiment of a branching filter according to the present invention.

FIG. 1 is a block diagram showing an illustrative embodiment of the present invention applied to a radio transceiver apparatus. In FIG. 1, reference numeral 51 denotes antenna (ANT) port, which is referred to as an input/output port or terminal; 56 a transmitter filter; 57 a receiver filter; 52 an input port of the receiver filter 57; 53 an output port of the transmitter filter 56; 54 denotes an input port of a transmitter filter 56; and 55 denotes an output port of the receiver filter 57. The ANT port 51 and the input port 52 are connected by line 60 having line length $l_{12}$, the input port 52 and output port 53 are connected by line 61 having line length $l_{23}$ and the input port 52 is connected to a reference potential such as ground by line 62 having line length $l_{20}$. From the viewpoint of the easy treatment, the strip line of 50Ω is often used for the lines 60, 61 and 62 respectively having line lengths $l_{12}$, $l_{23}$ and $l_{20}$.

Thus, the circuit structure shown in FIG. 1 is to provide a function of a branching or splitter filter circuit on the lines for connection between parts themselves, without providing a dedicated branching filter circuit.

First, for the purpose of simplifying the description, let us consider a case of $l_{12} = \infty$. Input admittance $Y_{in}$ seeing the filter side from the input port 52 is expressed by equation (5).

$$Y_{in} = Y_T + Y_{RF} \cdot Y_{20} \tag{5}$$

where $Y_T$ is a synthetic or combined admittance of the input admittance of the line 61 having line length $l_{23}$ and the input admittance of the transmitter filter 56, and is generally given by equation (6).

$$Y_T = \frac{Y_{TF}\cos\theta_{23} + j\sin\theta_{23}}{\cos\theta_{23} + jY_{TF}\sin\theta_{23}} \tag{6}$$

where $Y_{TF}$ is an input admittance of the transmitter filter 56, and $\theta_{23}$ is a phase constant (equal to $\beta l_{23}$). In addition, $Y_{RF}$ is an input admittance of the receiver filter 57, and $Y_{20}$ is an input admittance of the line 62 having line length $l_{20}$, and given by equation (7).

$$Y_{20} = -j\frac{\cos\theta_{20}}{\sin\theta_{20}} \tag{7}$$

where $\theta_{20}$ is the phase constant of the third line 62 having line length $l_{20}$ Therefore, when input admittance $Y_{RF}$ of said receiving filter 57 at a pass band (for example, 824.0 MHz–849.0 MHz, in the case of AMPS scheme in U.S. land mobile radiotelephone) of the transmitter filter 56 is expressed by equation (8) set forth below, the third line length $l_{20}$ of the third line 62 is determined in such a manner that the equation (8) is satisfied.

$$Y_{RF} \approx Y_{20} \tag{8}$$

Further, when synthetic admittance $Y_t$ at a pass band (for example, 869.0 MHz–894.0 MHz, in the case of AMPS scheme in U.S. land mobile radiotelephone) of the receiver filter 57 is expressed by equation (9) set forth below, the third line length $l_{20}$ of the third line 62 is determined in such a manner that the equation (9) is satisfied.

$$Y_T \approx Y_{20} \tag{9}$$

However, generally, it is impossible to simultaneously satisfy both of the equations (8) and (9). More specifically, input admittance $Y_{in}$ in a receiving band (869.0 MHz–894.0 MHz) of a dielectric filter for use in transmitting in the AMPS scheme is, from FIG. 7, given by $$Y_{in} \approx j\frac{1}{100} \tag{10}$$

Further, input admittance $Y_{in}$ in a transmitting band (824.0 MHz–849.0 MHz) of a dielectric filter for use in receiving in the AMPS scheme is, from FIG. 9, given by $$Y_{in} \approx j\frac{1}{20} \tag{11}$$

Therefore, equations (8) and (9) cannon simultaneously be satisfied. If a dielectric filter for use in transmission and a dielectric filter for use in reception are connected in parallel, an admittance at the receiving band of the dielectric filter for use in transmitting results in a remarkably undesirable reduction because of an admittance at the transmitting band of the dielectric filter for use in receiving defined by the equation (11). In view of this, an optimum line length $l_{20}$ is determined from the expressions (8) and (11). In other words, actually, admittance $Y_{RF}$ of said receiver filter 57 at a pass band of said transmitter filter 56 and synthetic admittance $Y_T$ at a pas band of said receiver filter 57 are expressed by $Y_{RF} \approx Y_{20}$ and $Y_T \approx Y_{20}$, respectively, the third line length $l_{20}$ of the third line 62 is determined in such a manner that either the equation $Y_{RF} \approx Y_{20}$ or the equation $Y_T \approx Y_{20}$ is satisfied.

Thus, in the case of $Z_{L12} = \infty$, where $Z_{L12}$ is the impedance which $l_{12}$ is provided with in FIG. 1, it is possible to construct a branching or multiplexer filter in which the line 62 having line length $l_{20}$ is provided, and the transmitter and receiver filters 56 and 57 are connected in parallel.

Next, operations of line 60 and 61 respectively having line lengths $l_{12}$ and $l_{23}$ will be described. Generally, in a case where a strip line having line length l is terminated with resistance $R_o$, the F matrix is given by the following relationship (12):

$$F = \begin{bmatrix} \cos\theta & j\sin\theta \\ j\sin\theta & \cos\theta \end{bmatrix} \begin{bmatrix} 1 & 0 \\ 1/R_o & 1 \end{bmatrix} \quad (12)$$

In this case, input impedance Zin is given by the following equation (13):

$$Z_{in} = \frac{\cos\theta + j\frac{\sin\theta}{R_o}}{j\sin\theta + \frac{\cos\theta}{R_o}} \quad (13)$$

Therefore, it is understood that the input impedance Zin is a function of line length l, since $\theta$ is given by $\beta l$. This means approximately that lines 60 and 61 having line lengths $l_{12}$ and $l_{23}$, respectively, simply make the impedance level move upwards or downwards from a reference value.

In order to use the line 60 having line length $l_{12}$ as a part of the branching filter, it is sufficient that a reference value of an impedance, seeing the transmitting and receiving filters 56 and 57 from the input/output port 51 shown in FIG. 1, be corrected. More in detail, input impedance $Z_{in}$ to said transmitter filter 56 and said receiver filter 57 from the input/output port 51 is expressed by the following Equation (14), which can be obtained by substitution of $1/R_o = Y_{in}$ and $\theta = \theta_{12}$ in equation (13), $$Z_{in} = \frac{\cos\theta_{12} + jY_{in}\sin\theta_{12}}{j\sin\theta_{12} + Y_{in}\cos\theta_{12}} \quad (14)$$

where $\theta_{12}$ is a phase constant of the first line 60 (conductive strip) having line length $l_{12}$. The input impedance Zin is adjusted by varying at least one component of the input admittance $Y_{TF}$ or $Y_{RF}$ contained in the admittance $Y_{in}$, in such a manner that a return loss seeing from the input/output port 51 is increased.

Regarding the line 61 having line length $l_{23}$, similar to the line 60 having line length $l_{12}$ as mentioned above, a reference value of an input impedance of the transmitter filter 56 is varied. Thus, in the case of a presence of the line 61 having line length $l_{23}$, it is sufficient that the input impedance of the transmitter filter 56 is previously corrected.

Thus, it is understood that regulation of the transmitting and receiving filters 56 and 57 including the lines 60 and 61 having line lengths $l_{12}$ and $l_{23}$, respectively, taking account of them as a part of the branching filter, makes it possible to reduce characteristics deterioration owing to line lengths $l_{12}$ and $l_{23}$, and also to provide a small occupied area as the branching circuit.

Figure 2:
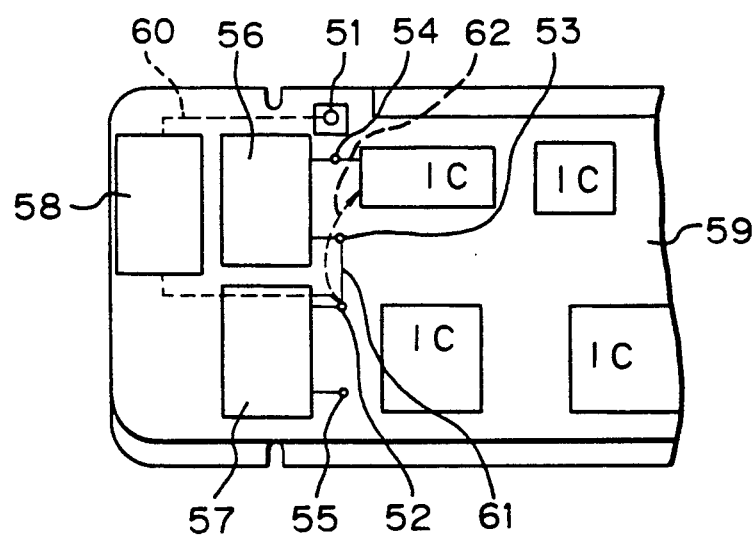
FIG. 2 is a top plan view showing an example of mounting the branching filter shown in FIG. 1.
Figure 3A:
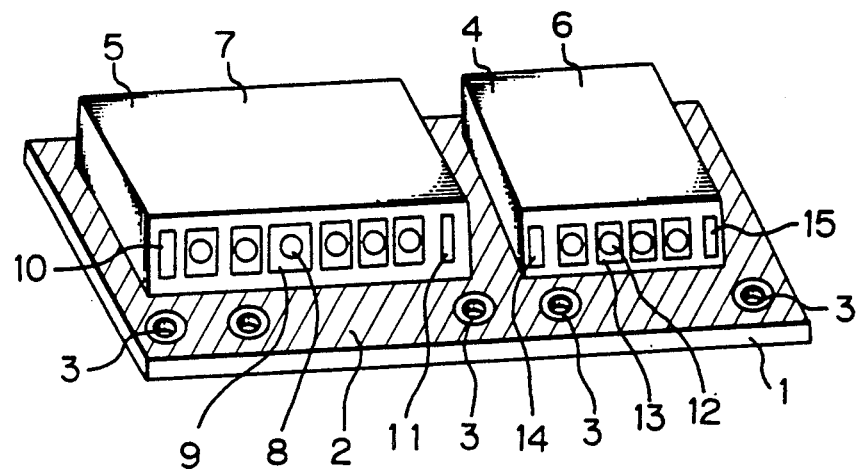
FIGS. 3A and 3B show structures of a conventional branching filter.
Figure 3B:
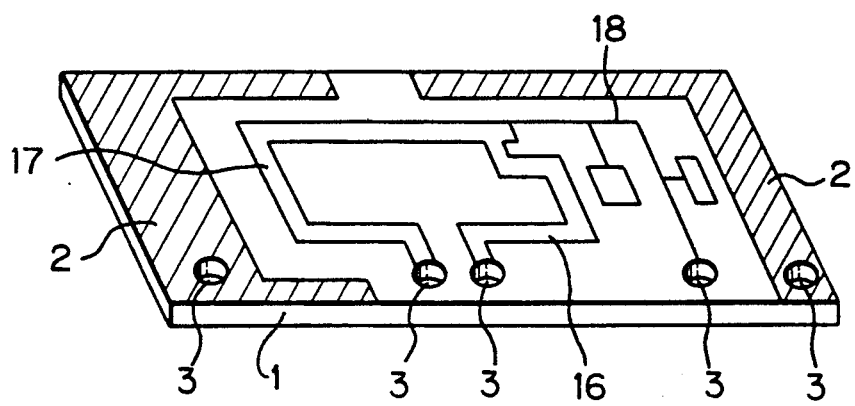
Figure 4:
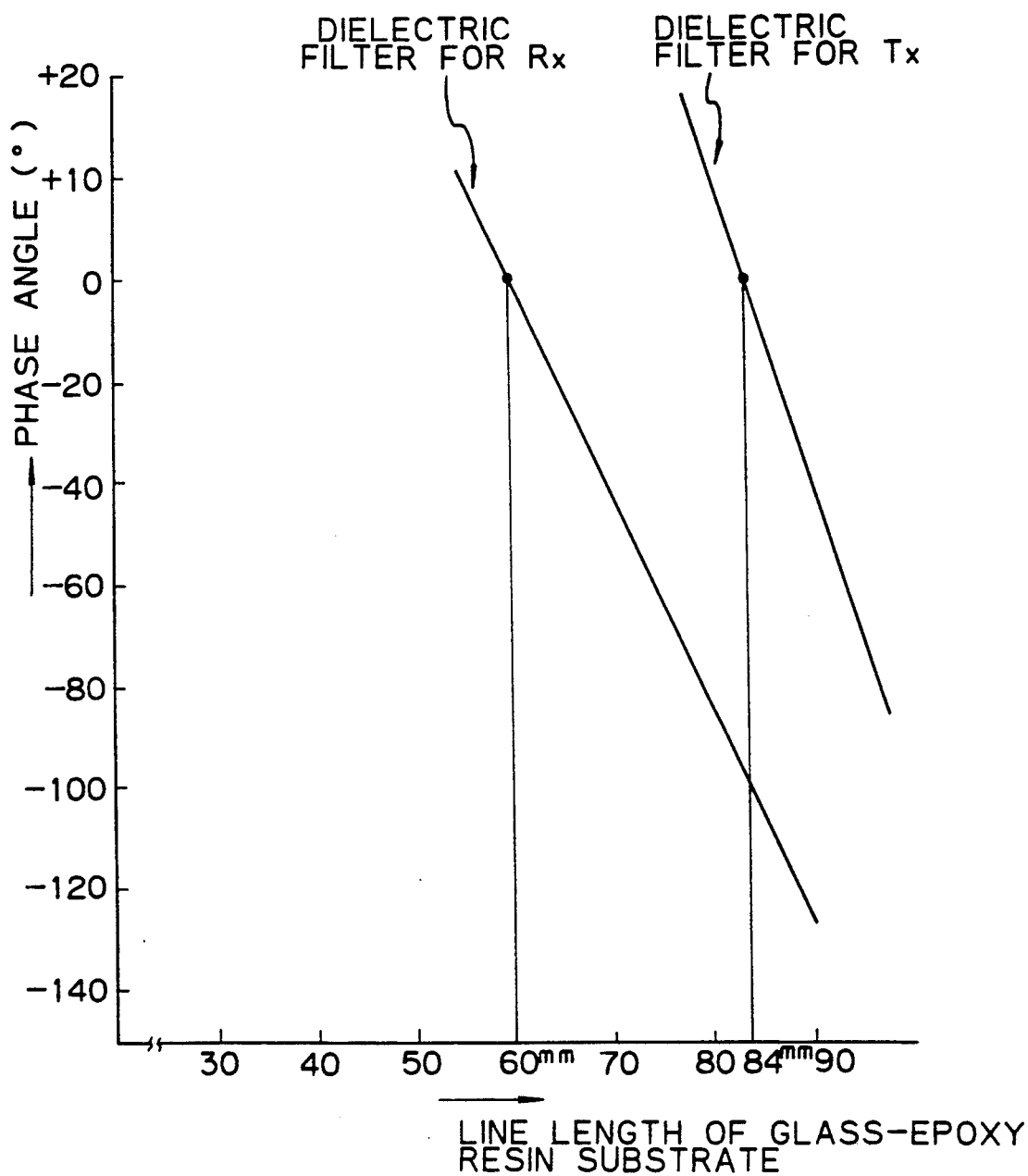
FIG. 4 shows a relationship between the line length and the phase angle.
Figure 5A:
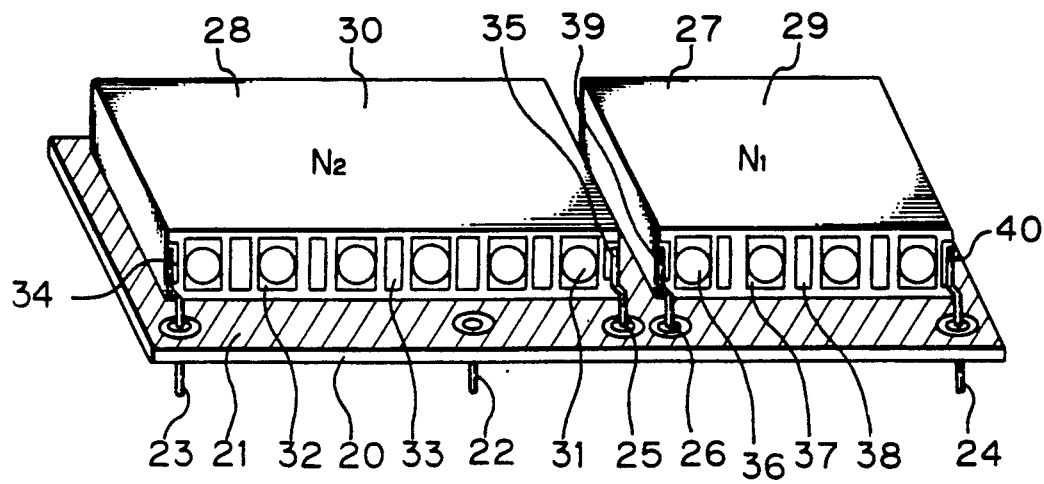
FIGS. 5A and 5B show structures of another conventional branching filter.
Figure 5B:
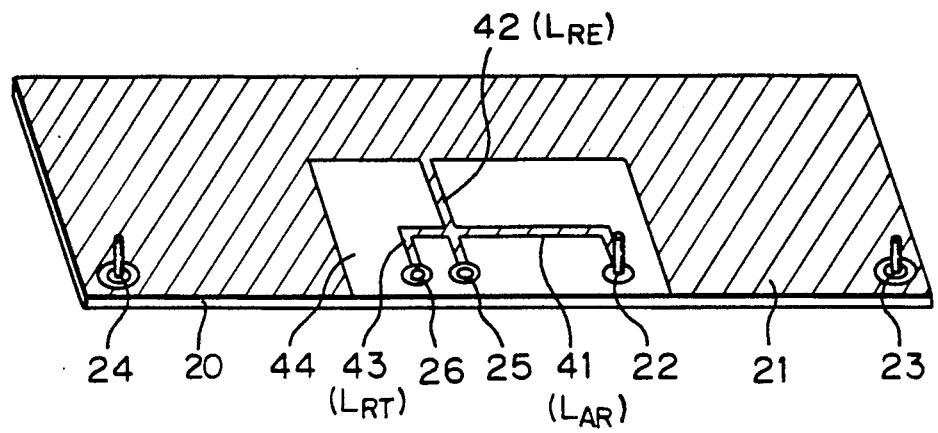
Figure 6:
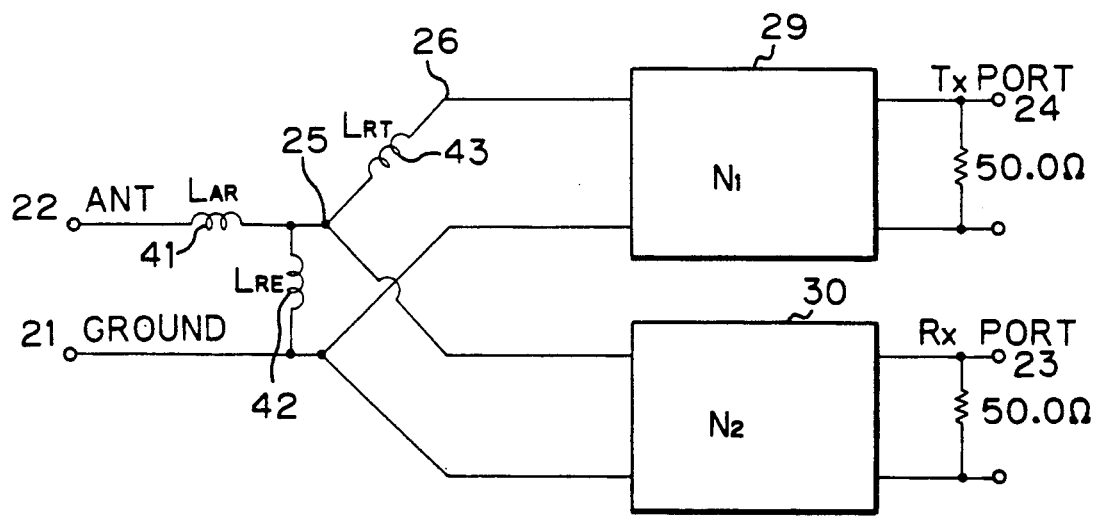
FIG. 6 is a schematic block diagram showing a circuit structure of the branching filter shown in FIGS. 5A and 5B.

FIG. 2 is a top plan view showing an example of how to mount the branching or multiplexer filter shown in and described with reference to FIG. 1. As shown in FIG. 2, there are provided on a substrate 59 of synthetic resin such as glass-epoxy resin or alumina the ANT port 51 to which an external or utility circuit is connected, the transmitter filter 56, the receiver filter 57, a changeover switch 58, the input and output pots 52 and 55 of the receiver filter 57, and the input and output ports 53 and 54 of the transmitter filter 56. The line 60 having line length $l_{12}$ extending from the ANT port 51 through the changeover switch 58 to input port 52, the line 61 having line length $l_{23}$ extending from the input port 52 to the input port 53, and the line 62 having line length $l_{20}$ extending from the input port 52 to the ground correspond to the lines 60, 61 and 62 having line lengths $l_{12}$, $l_{23}$ and $l_{20}$ depicted in FIG. 1, respectively. Those lines are formed as a intermediate layer of conductor on the substrate 59. It is thus understood that according to the present invention, no specific area is occupied on the substrate 59 of the multiplexer filter by a discrete or dedicated branching filter circuit which area would be specifically prepared in the prior art.

As described above, according to the present invention, when a branching filter is implemented by using a transmitting and a receiving filter, lines for connecting both of the filters with a utility or external circuit are used or function as a part of a branching filter circuit. Thus, extra area on a substrate is not consumed by a dedicated branching filter circuit which would otherwise be required. Accordingly, it is possible to provide an inexpensive miniaturized branching filter, and thus very useful for miniaturized radio apparatus manufactured at a reduced cost.

While the present invention has been described with reference to the particular illustrative embodiment, it is not to be restricted by the embodiment but only by the appended claims. It is to be appreciated that those skilled in the art can change or modify the embodiment without departing from the scope and spirit of the present invention.

What is claimed is:

1. A branching filter comprising:
  an input/output (I/O) port;
  a transmitter filter and a receiver filter, each said filter having a respective port, each said filter being a dielectric filter; and
  a branching filter circuit coupling said filters together, the branching filter circuit including:
  a first conductive strip line having a first line length $l_{12}$ coupling said I/O port with said receiver filter port;
  a second conductive strip line having a second line length $l_{23}$ coupled between said receiver filter port and said transmitter filter port; and
  a third conductive strip line having a third line length $l_{20}$ coupled between said receiver filter port and ground,
  said branching filter being configured so that for $Z_{L12} = \infty$, $Z_{L12}$ being the impedance corresponding to $l_{12}$, an input admittance $Y_{in}$ looking toward said transmitter filter and said receiver filter from the I/O port is expressed by the following equation:

$Y_{in} = Y_T + Y_{RF} + Y_{20}$ wherein
- $Y_T$ is a synthetic admittance of the input admittance of the second conductive strip line having the line length $l_{23}$,
- $Y_{RF}$ is the input admittance of said receiver filter, and
- $Y_{20}$ is the input admittance of the third line having line length $l_{20}$, $Y_T$ being expressed by the following equation, $$Y_T = \frac{Y_{TF}\cos\theta_{23} + j\sin\theta_{23}}{\cos\theta_{23} + jY_{TF}\sin\theta_{23}}$$

wherein
- $Y_{TF}$ is the input admittance of said transmitter filter,
- $\theta_{23}$ is the phase constant of the second line having line length $l_{23}$, and
- $Y_{20}$ being expressed by the following equation, $$Y_{20} = -j\frac{\cos\theta_{20}}{\sin\theta_{20}}$$

where $\theta_{20}$ is a phase constant of the third line having line length $l_{20}$;

wherein said input admittance $Y_{RF}$ of said receiver filter at a pass band of said transmitter filter is expressed by $Y_{RF} \approx Y_{20}$, and wherein the synthetic admittance $Y_T$ at a pass band of said receiver filter is expressed by $Y_T \approx Y_{20}$, the third line length $l_{20}$ of the third line being such that a selected one of $Y_{RF} \approx Y_{20}$ and $Y_T \approx Y_{20}$ is satisfied; and wherein the input impedance $Z_{in}$ looking toward said transmitter filter and said receiver filter from the I/O port is expressed by the following equation, $$Z_{in} = \frac{\cos\theta_{12} + jY_{in}\sin\theta_{12}}{j\sin\theta_{12} + Y_{in}\cos\theta_{12}}$$

wherein $\theta_{12}$ is a phase constant of the first line having line length $l_{12}$, the input admittance $Y_{TF}$ contained in the admittance $Y_{in}$ being such that the input impedance $Z_{in}$ is increased at a receiving frequency band, and the input admittance $Y_{RF}$ contained in the admittance $Y_{in}$ being such that the input impedance $Z_{in}$ is increased at a transmitting frequency band.

2. A branching filter according to claim 1 wherein said input impedance $Z_{in}$ is such that a return loss from the input/output port is larger than 10 db.

3. A branching filter according to claim 1 further comprising an insulative substrate, said input/output port, transmitter filter, receiver filter and branching filter circuit being mounted thereon.

4. A branching filter comprising:
an input/output port coupled through a branching filter circuit to a transmitter filter and a receiver filter, respectively for use in transmitting and receiving, each said filter having an input port and an output port; said branching filter circuit comprising:
a first conductive strip having a first line length $l_{12}$ and connecting said input/output port and said input port of said receiver filter;
a second conductive strip having a second line length $l_{23}$ and connecting said input port of said receiver filter and said output port of said transmitter filter; and a third conductive strip having a third line length $l_{20}$ provided between said input port of said receiver filter and a first potential, wherein for $Z_{L12} = \infty$, $Z_{L12}$ being the impedance corresponding to $l_{12}$, an input admittance $Y_{in}$ at the input port is expressed by the following equation:

$$Y_{in} = Y_T + Y_{RD} + Y_{20}$$

where $Y_{RF}$ is an input admittance of said receiver filter, $Y_{20}$ is an input admittance of the third line having line length $l_{20}$, and expressed by the equation:

$$Y_{20} = -j\frac{\cos\theta_{20}}{\sin\theta_{20}}$$

where $\theta_{20}$ is a phase constant of said third conductive strip having line length $l_{20}$, and $Y_T$ is a synthetic admittance, including an input admittance of the second conductive strip having line length $l_{23}$ and an input admittance of said transmitter filter, and is expressed by the equation:

$$Y_T = \frac{Y_{TF}\cos\theta_{23} + j\sin\theta_{23}}{\cos\theta_{23} + jY_{TF}\sin\theta_{23}}$$

where $Y_{TF}$ is an input admittance of said transmitter filter and $\theta_{23}$ is a phase constant of the second conductive strip having line length $l_{23}$, said input admittance $Y_{RF}$ of said receiver filter at a pass band of said transmitter filter and said synthetic admittance $Y_T$ at a pass band of said receiver filter are expressed by $Y_{RF} \approx Y_{20}$ and $Y_T \approx Y_{20}$, respectively, said third line length $l_{20}$ of the third conductive strip satisfying a selected one of equation $Y_{RF} \approx Y_{20}$ and equation $Y_T \approx Y_{20}$, and wherein an input impedance $Z_{in}$ at the input/output port is expressed by the equation $$Z_{in} = \frac{\cos\theta_{12} + jY_{in}\sin\theta_{12}}{j\sin\theta_{12} + Y_{in}\cos\theta_{12}}$$

where $\theta_{12}$ is a phase constant of the first conductive strip having line length $l_{12}$, said input impedance $Z_{in}$ having at least a selected one of the components of said input admittances $Y_{TF}$ and $Y_{RF}$ contained in said admittance $Y_{in}$ to achieve an increased return loss at said input/output port.

5. A branching filter according to claim 4 wherein said input impedance $Z_{in}$ is such that a return loss from the input/output port is larger than 10 db.

6. A branching filter according to claim 4, further comprising an insulative substrate, wherein said input/output port, said transmitter filter, said receiver filter and said branching filter circuit are mounted thereon.

7. A method of constructing a branching filter comprising a transmitter filter having input and output ports, a receiver filter having input and output ports, an input/output (I/O) port, and a ground, said method comprising the steps of:
coupling a first conductive strip line having a first line length $l_{12}$ between said input/output port and said input port of said receiver filter;
coupling a second conductive strip line having a second line length $l_{23}$ between said input port of said receiver filter and said output port of said transmitter filter;

coupling a third conductive strip line having a third line length $l_{20}$ between said I/O port and said ground;

configuring the filters and first, second, and third conductive strip lines so that for $Z_{L12} = \infty$, $Z_{L12}$ being the impedance corresponding to $l_{12}$, an input admittance $Y_{in}$ looking toward said transmitter filter and said receiver filter from the input port is expressed by the following equation:

$$Y_{in} = Y_T + Y_{RF} + Y_{20}$$

where $Y_T$ is a synthetic admittance of an input admittance of the second line having line length $l_{23}$ and an input admittance of said transmitter filter, and is expressed by the following equation:

$$Y_T = \frac{Y_{TF} \cos\theta_{23} + j\sin\theta_{23}}{\cos\theta_{23} + jY_{TF}\sin\theta_{23}}$$

wherein:

$Y_{TF}$ is the input admittance of said transmitter filter, $\theta_{23}$ is the phase constant of the second line having line length $l_{23}$, $Y_{RF}$ is the input admittance of said receiver filter, and $Y_{20}$ is the input admittance of the third conductive strip line having line length $l_{20}$, and is expressed by the following equation:

$$Y_{20} = -j\frac{\cos\theta_{20}}{\sin\theta_{20}}$$

wherein $\theta_{20}$ is a phase constant of the third conductive strip line having line length $l_{20}$, wherein, assuming that the synthetic admittance $Y_T$ at a pass band of said receiver filter is $Y_{T1}$, the third line length $l_{20}$ of the third conductive strip line is such that the equation $Y_{T1} \approx Y_{20}$ is satisfied; and wherein an input impedance $Z_{in}$ looking toward said transmitter filter and said receiver filter from the input/output port is expressed by the following equation:

$$Z_{in} = \frac{\cos\theta_{12} + jY_{in}\sin\theta_{12}}{j\sin\theta_{12} + Y_{in}\cos\theta_{12}}$$

wherein $\theta_{12}$ is phase constant of the first line having line length $l_{12}$;

adjusting the input admittance $Y_{TF}$ contained in the admittance $Y_{in}$ in such a manner that the input impedance $Z_{in}$ is increased at a receiving frequency band; and adjusting the input admittance $Y_{RF}$ contained in the admittance $Y_{in}$ in such a manner that the input impedance $Z_{in}$ is increased at a transmitting frequency band.

* * * * *

UNITED STATES PATENT AND TRADEMARK OFFICE
CERTIFICATE OF CORRECTION

PATENT NO. : 5,323,127
DATED : June 21, 1994
INVENTOR(S) : Komazaki et al.

It is certified that error appears in the above-indentified patent and that said Letters Patent is hereby corrected as shown below:

On the title page: Item [56]
In the Foreign Application Priority Data, delete the Japanese application number "3-197709" and insert "2-197709".

Signed and Sealed this

Twenty-seventh Day of September, 1994

Attest:

BRUCE LEHMAN

*Attesting Officer*       *Commissioner of Patents and Trademarks*